United States Patent
Hsu et al.

(10) Patent No.: US 10,146,982 B2
(45) Date of Patent: Dec. 4, 2018

(54) METHOD FOR ASSEMBLING FINGERPRINT IDENTIFICATION MODULE

(71) Applicant: Primax Electronics Ltd., Taipei (TW)

(72) Inventors: Mao-Hsiu Hsu, Taipei (TW); Hsin-Tso Chen, Taipei (TW); Ying-Chieh Chuang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 106 days.

(21) Appl. No.: 15/292,562

(22) Filed: Oct. 13, 2016

(65) Prior Publication Data

US 2018/0039814 A1 Feb. 8, 2018

(30) Foreign Application Priority Data

Aug. 5, 2016 (TW) .............................. 105124966 A

(51) Int. Cl.
*G06K 9/00* (2006.01)
*H04N 17/00* (2006.01)

(52) U.S. Cl.
CPC ..... *G06K 9/00013* (2013.01); *G06K 9/00087* (2013.01); *H04N 17/002* (2013.01)

(58) Field of Classification Search
CPC ... G06K 9/00087; G06K 9/00013–2009/0006; H04N 17/002
See application file for complete search history.

(56) References Cited

U.S. PATENT DOCUMENTS

| 5,483,229 | A  | * | 1/1996 | Tamura | H05K 7/1468 340/691.7 |
|---|---|---|---|---|---|
| 6,099,745 | A  | * | 8/2000 | McKenney | H05K 3/062 174/254 |
| 8,278,153 | B2 | * | 10/2012 | Misumi | H01L 25/50 438/118 |
| 2002/0003960 | A1 | * | 1/2002 | Melman | H04N 5/2253 396/429 |
| 2003/0026553 | A1 | * | 2/2003 | Stack | H01L 27/14618 385/88 |
| 2006/0131501 | A1 | * | 6/2006 | Ikushima | G01J 5/02 250/338.1 |
| 2008/0049980 | A1 | * | 2/2008 | Castaneda | G06K 9/00013 382/115 |
| 2009/0289526 | A1 | * | 11/2009 | Sinha | H03H 9/15 310/325 |

(Continued)

*Primary Examiner* — Brenda C Bernardi
(74) *Attorney, Agent, or Firm* — Muncy, Geissler, Olds & Lowe, PC

(57) ABSTRACT

A method for assembling the fingerprint identification module is provided. Firstly, a protective cover and a fingerprint sensing element are combined together. Then, the fingerprint sensing element is placed on the circuit board. Then, a triggering element is placed on the circuit board. Then, an adhesive thickness is obtained according to a predetermined thickness and the thicknesses of the protective cover, the fingerprint sensing element, the triggering element and the circuit board. Then, an adhesive film corresponding to the adhesive thickness is placed on the circuit board. Since the appropriate adhesive film is selected according to the demand, the thickness of the fingerprint identification module is substantially identical to the predetermined thickness.

9 Claims, 12 Drawing Sheets

(56) References Cited

U.S. PATENT DOCUMENTS

| | | | |
|---|---|---|---|
| 2011/0309482 A1* | 12/2011 | Salatino | G06K 9/00053 257/659 |
| 2013/0216805 A1* | 8/2013 | Yasui | G02B 5/3025 428/216 |
| 2013/0259329 A1* | 10/2013 | Wickboldt | H05K 1/189 382/124 |
| 2014/0216914 A1* | 8/2014 | Pope | G06F 3/044 200/600 |
| 2014/0263970 A1* | 9/2014 | Heimbuch | G01J 1/0411 250/208.2 |
| 2014/0295150 A1* | 10/2014 | Bower | C09J 7/02 428/201 |
| 2015/0071509 A1* | 3/2015 | Myers | G06K 9/0002 382/124 |
| 2015/0334859 A1* | 11/2015 | Lee | H05K 5/0247 361/749 |
| 2016/0056527 A1* | 2/2016 | Pascolini | G06K 9/00006 343/702 |
| 2016/0077622 A1* | 3/2016 | Lee | G06F 1/1626 345/173 |
| 2016/0099232 A1* | 4/2016 | Hatori | H01L 25/0657 257/778 |
| 2016/0162724 A1* | 6/2016 | Hsiao | G06K 9/00053 73/865.8 |
| 2016/0171270 A1* | 6/2016 | Lu | G06K 9/0002 382/124 |
| 2017/0220837 A1* | 8/2017 | Dunlap | G06K 7/1417 |
| 2017/0235403 A1* | 8/2017 | Miller | G06K 9/0002 345/173 |
| 2017/0293792 A1* | 10/2017 | Lavin | G06K 9/00053 |
| 2017/0308228 A1* | 10/2017 | Benkley, III | H01L 27/323 |
| 2017/0316252 A1* | 11/2017 | Yang | G06K 9/00087 |
| 2017/0362697 A1* | 12/2017 | Richter | C23C 16/01 |
| 2017/0372123 A1* | 12/2017 | Kim | G06K 9/00087 |
| 2018/0025208 A1* | 1/2018 | Wang | G06K 9/0002 |
| 2018/0039815 A1* | 2/2018 | Jung | G06K 9/00013 |

* cited by examiner

METHOD FOR ASSEMBLING FINGERPRINT IDENTIFICATION MODULE

FIELD OF THE INVENTION

The present invention relates to an assembling method, and more particularly to a method for assembling a fingerprint identification module.

BACKGROUND OF THE INVENTION

Recently, a fingerprint identification technology has been applied to a variety of electronic products. By using the fingerprint identification technology, the user's fingerprint can be inputted into an electronic product and saved in the electronic product. For unlocking the electronic product, the user has to input the fingerprint through a fingerprint identification module. The way of unlocking the electronic product by the fingerprint identification technology is faster and more user-friendly than the way of manually inputting the password. Consequently, the fingerprint identification technology is favored by many users, and the demands on the fingerprint identification module are gradually increased.

Generally, a fingerprint identification module comprises a fingerprint sensing element, a protective cover, a metallic ring and a circuit board. The fingerprint sensing element is disposed on and electrically connected with the circuit board. The fingerprint sensing element is used for sensing the user's finger and retrieving the information of the user's finger. The protective cover is used for covering the fingerprint sensing element in order to protect the fingerprint sensing element. The user's finger is only permitted to touch the protective cover. Since the user's finger is not directly contacted with the fingerprint sensing element, the fingerprint sensing element is not easily damaged. The metallic ring is sheathed around the protective cover. The fingerprint sensing element is used for transferring the charges of the user's finger in order to facilitate the operations of the fingerprint sensing element.

A process of assembling a conventional fingerprint identification module will be described as follows. Firstly, the fingerprint sensing element is placed on the circuit board, and the fingerprint sensing element is electrically connected with the circuit board. Then, the protective cover is stacked on the fingerprint sensing element, and the protective cover and the fingerprint sensing element are adhered on each other. After the metallic ring is sheathed around the protective cover, the conventional fingerprint identification module is assembled.

However, the method for assembling the fingerprint identification module still has some drawbacks. For example, the components of the conventional fingerprint identification module have their production tolerances. Moreover, it is necessary to apply glue on the associated components during the assembling process. If the thickness of the fingerprint identification module is deviated from the standard thickness after the above assembling process, the fingerprint identification module is determined as an unqualified product.

Therefore, there is a need of providing a method for assembling a fingerprint identification module with high yield.

SUMMARY OF THE INVENTION

The present invention provides a method for assembling a fingerprint identification module with high yield.

In accordance with an aspect of the present invention, there is provided a method for assembling a fingerprint identification module. The method includes the following steps. In a step (A), a protective cover and a fingerprint sensing element are combined together. In a step (B), the fingerprint sensing element is placed on a first region of a circuit board, and a triggering element is placed on a second region of the circuit board. The fingerprint sensing element is located beside the triggering element. In a step (C), an adhesive thickness is obtained according to thicknesses of the protective cover, the fingerprint sensing element, the triggering element and the circuit board. In a step (D), an adhesive film corresponding to the adhesive thickness is placed on the circuit board, and the first region of the circuit board is folded and stacked on the second region of the circuit board. Consequently, the fingerprint identification module is assembled. The adhesive film is arranged between the second region of the circuit board and the folded first region of the circuit board.

In accordance with another aspect of the present invention, there is provided a method for assembling a fingerprint identification module. The method includes the following steps. In a step (A), a protective cover and a fingerprint sensing element are combined together. In a step (B), the fingerprint sensing element is placed on a first circuit board. In a step (C), a triggering element is placed on a second circuit board. In a step (D), an adhesive thickness is obtained according to thicknesses of the protective cover, the fingerprint sensing element, the triggering element, the first circuit board and the second circuit board. In a step (E), an adhesive film corresponding to the adhesive thickness is placed on the first circuit board, and the second circuit board and the adhesive film to be stacked on each other. Consequently, the fingerprint identification module is assembled. The adhesive film is arranged between the first circuit board and the second circuit board.

From the above descriptions, the present invention provides a method for assembling a fingerprint identification module. Firstly, the protective cover, the fingerprint sensing element and the metallic ring are combined together. Then, the stacked fingerprint sensing element is placed on the circuit board. When compared with the conventional technology, the height difference between the metallic ring and the protective cover can be adjusted according to the practical requirements. After the thickness of the stacked fingerprint sensing element and the thickness of the circuit board are measured, the first thickness is obtained. After the thickness of the triggering element and the thickness of the circuit board are measured, the second thickness is obtained. Then, the adhesive thickness is obtained by subtracting the first thickness and the second thickness from the predetermined thickness. Then, the adhesive film corresponding to the film thickness is placed on the circuit board. Afterward, the first region of the circuit board is folded and stacked on the second region of the circuit board, and thus the fingerprint identification module is assembled. The technology of the present invention is advantageous over the conventional technology. For example, the height difference between the metallic ring and the protective cover can be adjusted through the thin film. Moreover, the thickness difference between the semi-finished product and the predetermined thickness is obtained. The adhesive film corresponding to the thickness difference is used to compensate the deficient thickness. Consequently, the yield of the fingerprint identification module is increased.

The above objects and advantages of the present invention will become more readily apparent to those ordinarily

DETAILED DESCRIPTION OF THE PREFERRED EMBODIMENT

For solving the drawbacks of the conventional technologies, the present invention provides a method for assembling a fingerprint identification module.

Figure 1:
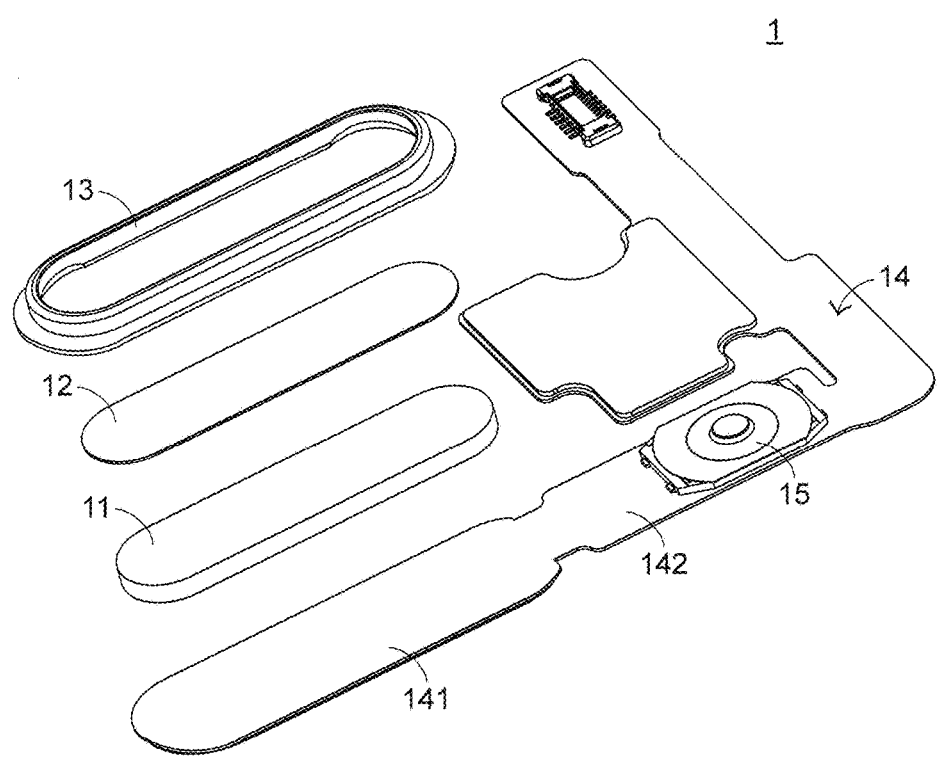
FIG. 1 is a schematic exploded view illustrating a fingerprint identification module according to a first embodiment of the present invention.

FIG. 1 is a schematic exploded view illustrating a fingerprint identification module according to a first embodiment of the present invention. As shown in FIG. 1, the components of the fingerprint identification module 1 comprise a fingerprint sensing element 11, a protective cover 12, a metallic ring 13, a circuit board 14 and a triggering element 15. The functions of these components are similar to those of the conventional fingerprint identification module, and are not redundantly described herein. In an embodiment, the fingerprint sensing element 11 has a land grid array (LGA) package structure, the protective cover 12 is made of a ceramic material or a glass material, and the circuit board 14 is a flexible printed circuit (FPC) or a rigid-flex board.

Figure 2A:
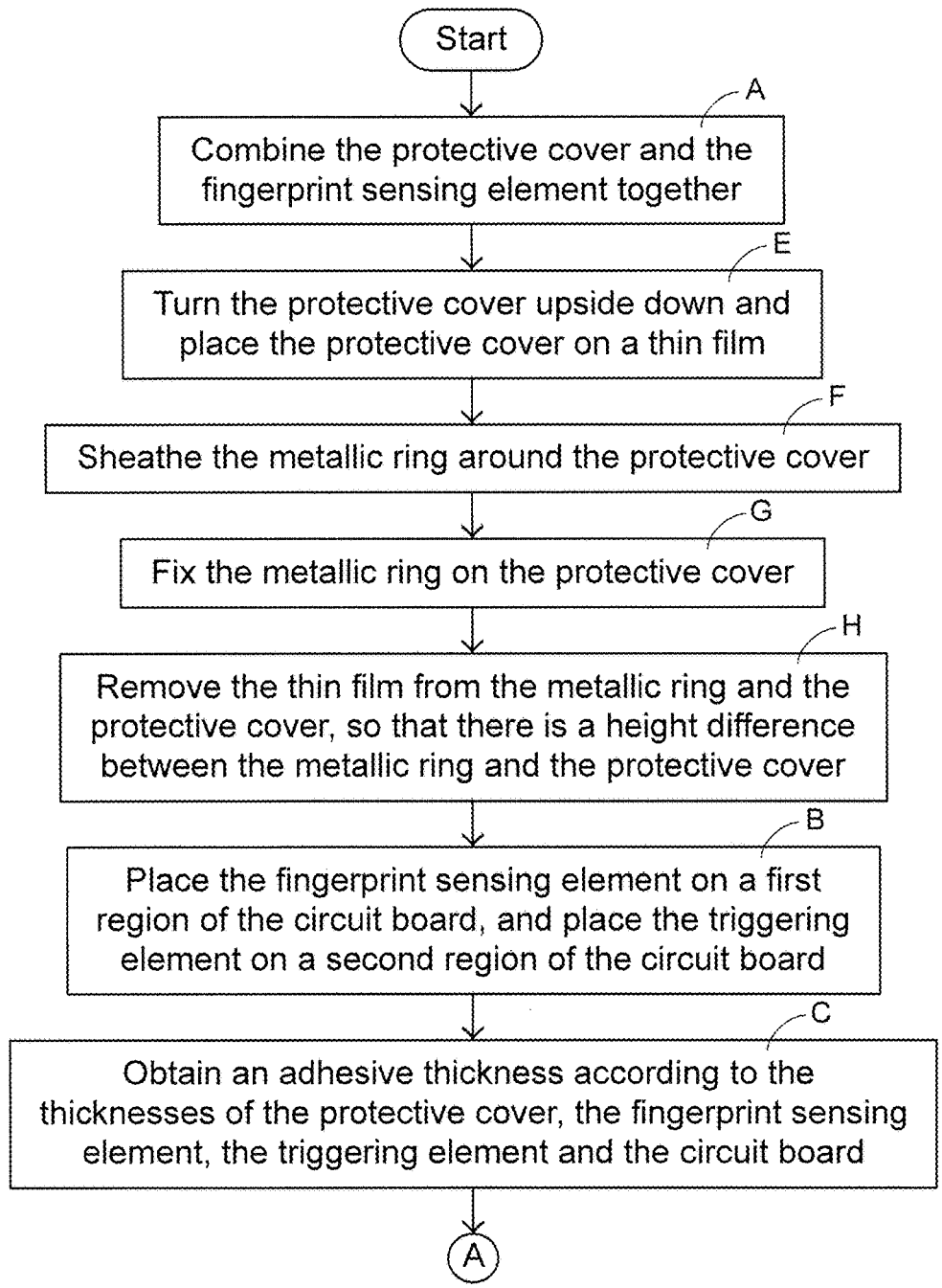
FIGS. 2A and 2B schematically illustrate a flowchart of a method for assembling the fingerprint identification module according to the first embodiment of the present invention.
Figure 2B:
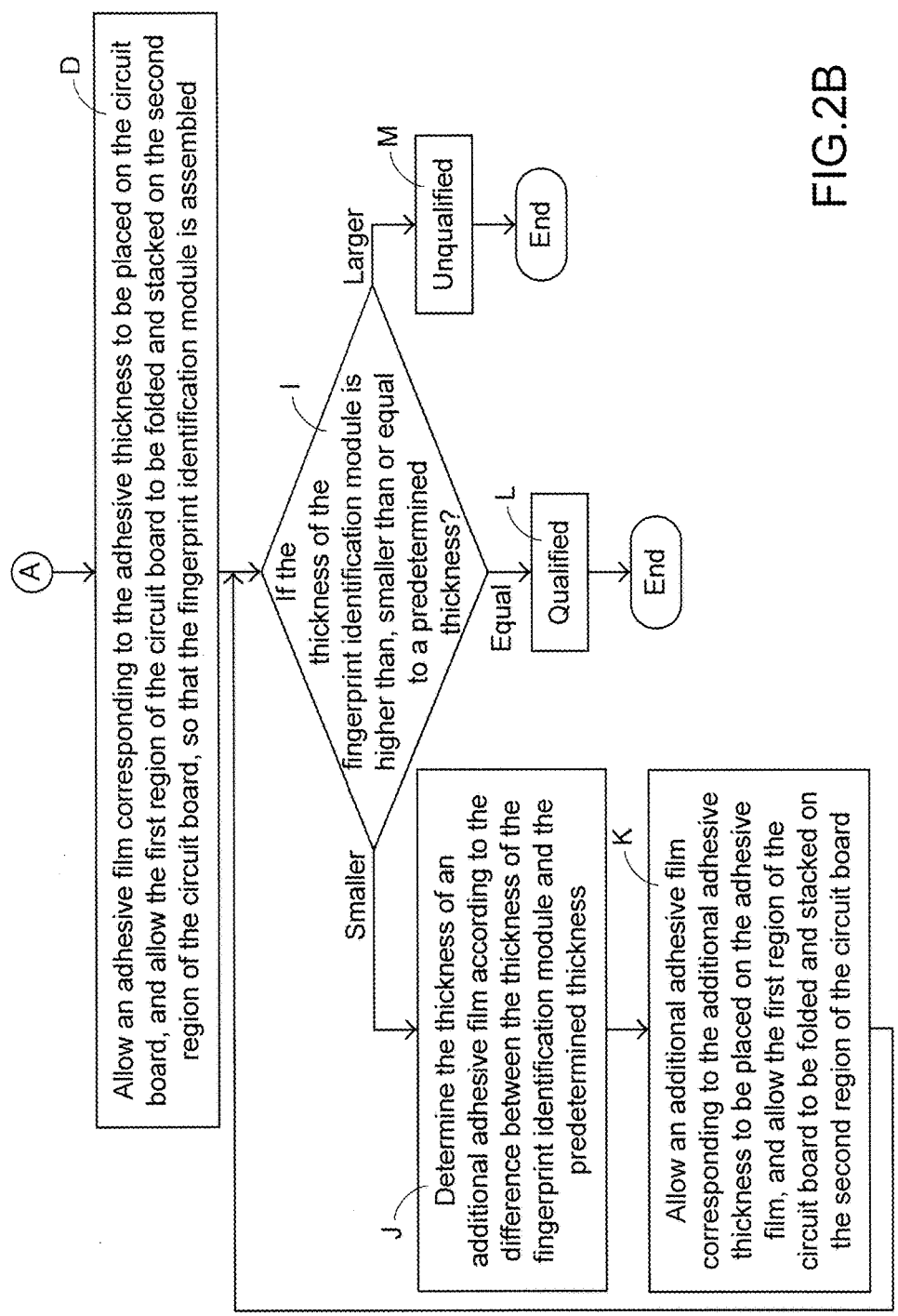

FIGS. 2A and 2B schematically illustrate a flowchart of a method for assembling the fingerprint identification module according to the first embodiment of the present invention. The method comprises the following steps.

In a step A, the protective cover and the fingerprint sensing element are combined together.

In a step E, the protective cover is turned upside down and placed on a thin film.

In a step F, the metallic ring is sheathed around the protective cover.

In a step G, the metallic ring is fixed on the protective cover.

In a step H, the thin film is removed from the metallic ring and the protective cover, so that there is a height difference between the metallic ring and the protective cover.

In a step B, the fingerprint sensing element is placed on a first region of the circuit board, and the triggering element is placed on a second region of the circuit board.

In a step C, an adhesive thickness is obtained according to the thicknesses of the protective cover, the fingerprint sensing element, the triggering element and the circuit board.

In a step D, an adhesive film corresponding to the adhesive thickness is placed on the circuit board, and the first region of the circuit board is folded and stacked on the second region of the circuit board, so that the fingerprint identification module is assembled.

In a step I, the thickness of the fingerprint identification module is compared with a predetermined thickness.

In a step J, the thickness of an additional adhesive film is determined according to the difference between the thickness of the fingerprint identification module and the predetermined thickness.

In a step K, an additional adhesive film corresponding to the additional adhesive thickness is placed on the adhesive film, and the first region of the circuit board is folded and stacked on the second region of the circuit board.

In a step L, the fingerprint identification module is determined as a qualified product.

In a step M, the fingerprint identification module is determined as an unqualified product.

The step A comprises steps A1, A2 and A3. In the step A1, a gluing material is applied to the fingerprint sensing element. In the step A2, the protective cover is stacked on the fingerprint sensing element. In the step A3, the gluing material overflowing from the region between the protective cover and the fingerprint sensing element is removed.

The step B comprises steps B1, B2 and B3. In the step B1, the fingerprint sensing element is placed on the first region of the circuit board by a surface mount technology, and the electric connection between the fingerprint sensing element and the circuit board is established. In the step B2, the triggering element is placed on the second region of the circuit board by the surface mount technology, and the electric connection between the triggering element and the circuit board is established.

The step C comprises steps C1, C2 and C3. In the step C1, the thickness of the stacked fingerprint sensing element and the thickness of the first region of the circuit board are measured, and thus a first thickness is obtained. In the step C2, the thickness of the triggering element and the thickness of the second region of the circuit board are measured, and thus a second thickness is obtained. In the step C3, the adhesive thickness is obtained according to the difference between the predetermined thickness and the sum of the first thickness and the second thickness.

If the comparing result of the step I indicates that thickness of the fingerprint identification module is larger than the predetermined thickness, the step M is performed. If the comparing result of the step I indicates that thickness of the fingerprint identification module is equal to the predetermined thickness, the step L is performed. If the comparing result of the step I indicates that thickness of the fingerprint identification module is smaller than the predetermined thickness, the step J is performed. After the step K is completed, the step I is repeatedly done.

Figure 3:
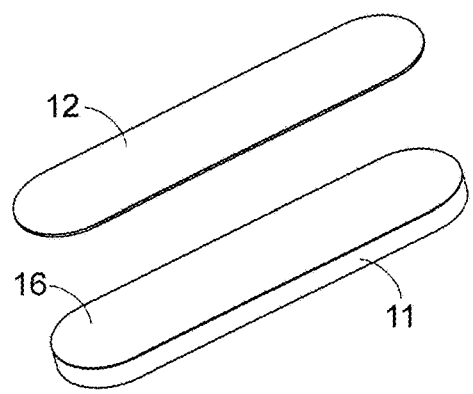
FIG. 3 illustrates a flowchart of the step A of the method for assembling the fingerprint identification module according to the first embodiment of the present invention.

The operations of the method for assembling the fingerprint identification module will be described in more details as follows. Please refer to FIGS. 2A, 2B and 3. FIG. 3 illustrates a flowchart of the step A of the method for assembling the fingerprint identification module according to the first embodiment of the present invention. Firstly, the steps A1 and A2 are performed. Firstly, the gluing material 16 is applied to a top surface of the fingerprint sensing element 11. Then, the protective cover 12 is stacked on the fingerprint sensing element 11. After the protective cover 12 is stacked on the fingerprint sensing element 11, a portion of the gluing material 16 overflows from the region between the protective cover 12 and the fingerprint sensing element 11. Then, the step A3 is performed. That is, the gluing material 16 overflowing from the region between the protective cover 12 and the fingerprint sensing element 11 is removed. The combination of the protective cover 12 and the fingerprint sensing element 11 can be seen in FIG. 4.

Figure 4:
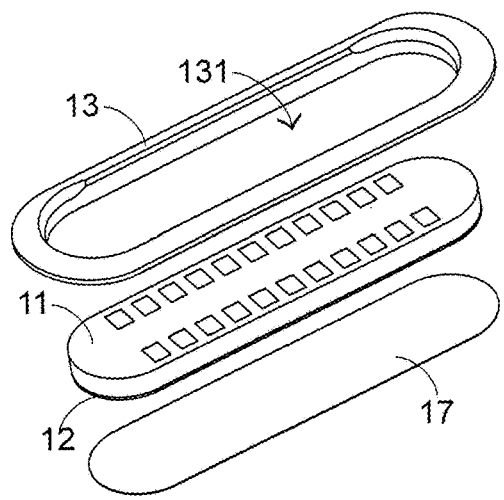
FIGS. 4, 5 and 6 illustrate a flowchart of the steps E, F, G and H of the method for assembling the fingerprint identification module according to the first embodiment of the present invention.
Figure 5:
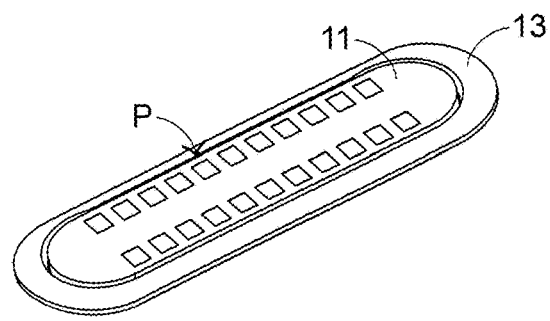
Figure 6:
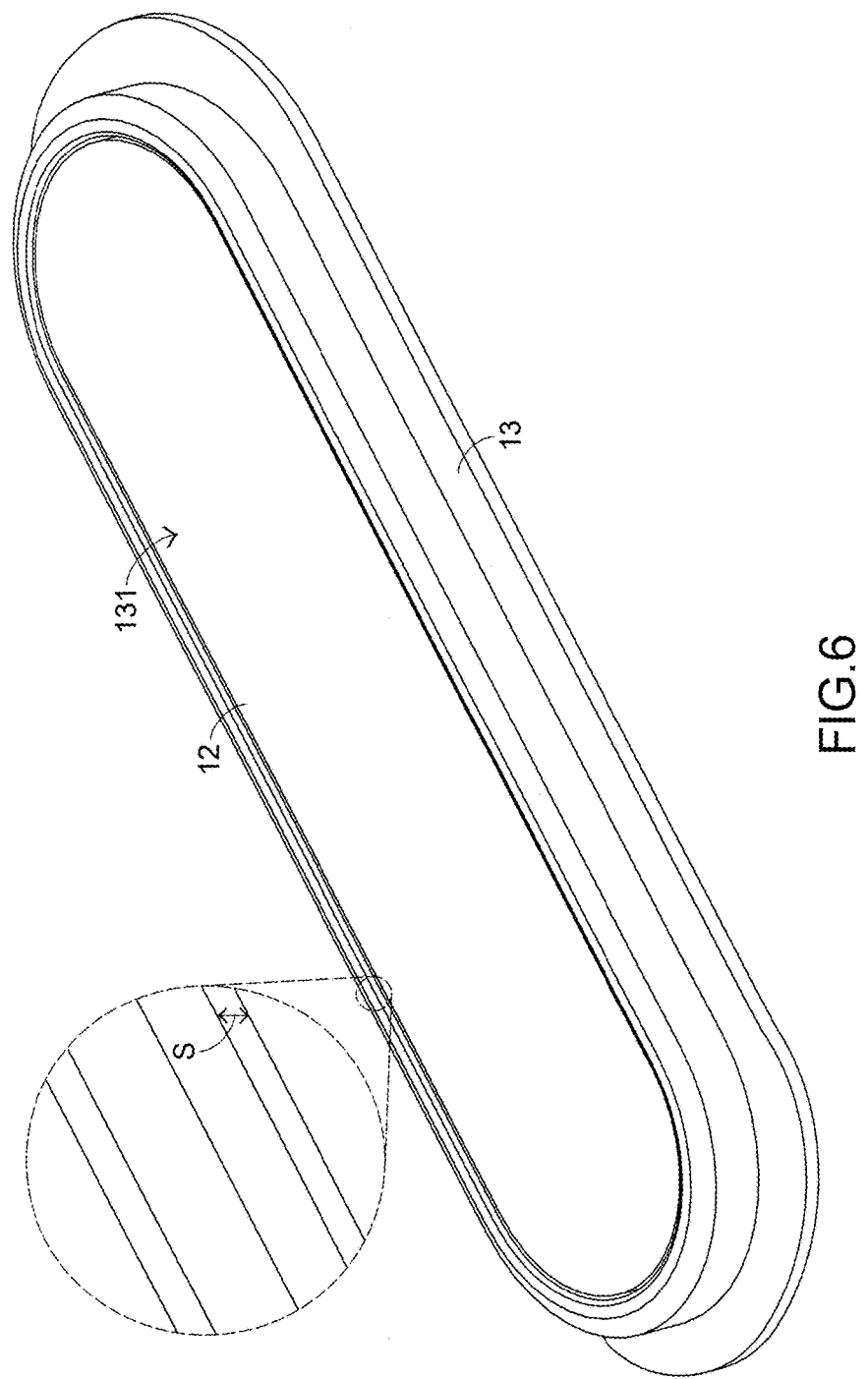

Please refer to FIGS. 2-6. FIGS. 4, 5 and 6 illustrate a flowchart of the steps E, F, G and H of the method for assembling the fingerprint identification module according to the first embodiment of the present invention. After the protective cover 12 and the fingerprint sensing element 11 are combined together, the procedure of assembling the metallic ring 13 is performed. In the step E, the protective cover 12 is turned upside down and placed on a thin film 17. In an embodiment, the thin film 17 is a polyethylene terephthalate (PET) film. Then, the metallic ring 13 is sheathed around the protective cover 12 and the thin film 17. That is, the metallic ring 13 is sheathed around the combination of the fingerprint sensing element 11 and the protective cover 12. Consequently, as shown in FIG. 5, the thin film 17 and the combination of the fingerprint sensing element 11 and the protective cover 12 are disposed within an opening 131 of the metallic ring 13. Meanwhile, there is a gap P between an inner wall of the metallic ring 13 and an external wall of the protective cover 12. Then, a gluing material is filled in the gap P. Consequently, the metallic ring 13 is fixed on the protective cover 12 (i.e., the step G). Then, the thin film 17 is removed from the opening 131 of the metallic ring 13 (i.e., the step H). Meanwhile, as shown in FIG. 6, there is a height difference S between the top surface of the metallic ring 13 and the top surface of the protective cover 12. The height difference S is equal to the thickness of the thin film 17.

The following two items should be specially described. Firstly, the height difference S between the top surface of the metallic ring 13 and the top surface of the protective cover 12 is elaborately designed. The height difference S cannot be too large. If the height difference S is too large, the user may obviously feel the height difference when the user's finger touches the metallic ring 13. Under this circumstance, the user's finger is easily scratched. The height difference S is determined according to the thin film 17. Moreover, the height difference S is equal to the thickness of the thin film 17. In other words, the fixed height difference S is created because the thin film 17 is arranged between the metallic ring 13 and the protective cover 12. In some other embodiments, the thin films with different thicknesses are employed to meet different requirements. Secondly, the metallic ring is not the essential component. In case that the fingerprint identification module is not equipped with the metallic ring, the steps E, F, G and H are omitted.

Then, the step B1 is performed. That is, the fingerprint sensing element 11 with the metallic ring 13 is placed on the first region 141 of the circuit board 14 by a surface mount technology (SMT), and the electric connection between the fingerprint sensing element 11 and the circuit board 14 is established. Moreover, the step B2 is performed. That is, the triggering element 15 is placed on the second region 142 of the circuit board 14 by the surface mount technology, and the electric connection between the triggering element 15 and the circuit board 14 is established. The sequences of the step B1 and the step B2 are not restricted. For example, in an embodiment, the step B2 is performed after the step B1. In other embodiment, the step B1 is performed after the step B2. In a further embodiment, the step B1 and the step B2 are performed simultaneously. In an embodiment, the triggering element 15 is a switch or a pressure sensor.

Figure 7:
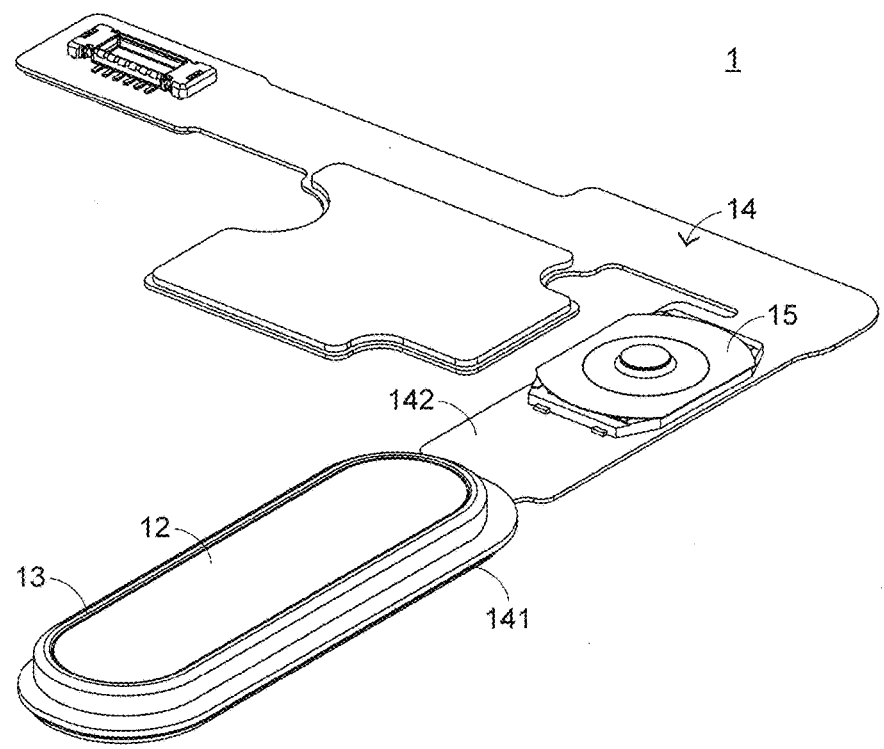
FIGS. 7 and 8 illustrate a flowchart of the step C of the method for assembling the fingerprint identification module according to the first embodiment of the present invention.
Figure 8:
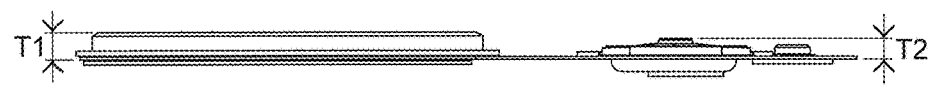

Please refer to FIG. 2 and FIG. 8. FIGS. 7 and 8 illustrate a flowchart of the step C of the method for assembling the fingerprint identification module according to the first embodiment of the present invention. After the fingerprint sensing element 11 and the triggering element 15 are placed on the circuit board 14, the step C1 is performed. That is, after the thickness of the stacked fingerprint sensing element 11 and the thickness of the first region 141 of the circuit board 14 are measured, a first thickness T1 is obtained. In this embodiment, the stacked fingerprint sensing element 11 comprises the fingerprint sensing element 11, the protective cover 12 and the metallic ring 13. Moreover, in the step C2, the thickness of the triggering element 15 and the thickness of the second region 142 of the circuit board 14 are measured, and thus a second thickness T2 is obtained. Similarly, the sequences of the step C1 and the step C2 are not restricted. For example, in an embodiment, the step C2 is performed after the step C1. In other embodiment, the step C1 is performed after the step C2. In a further embodiment, the step C1 and the step C2 are performed simultaneously. After the first thickness T1 and the second thickness T2 are obtained, the step C3 is performed. That is, the difference between the predetermined thickness and the sum of the first thickness T1 and the second thickness T2 is calculated. The difference is the desired adhesive thickness. The predetermined thickness is an ideal thickness of the fingerprint identification module. That is, the predetermined thickness is a standard of judging whether the fingerprint identification module is qualified or not.

Figure 9:
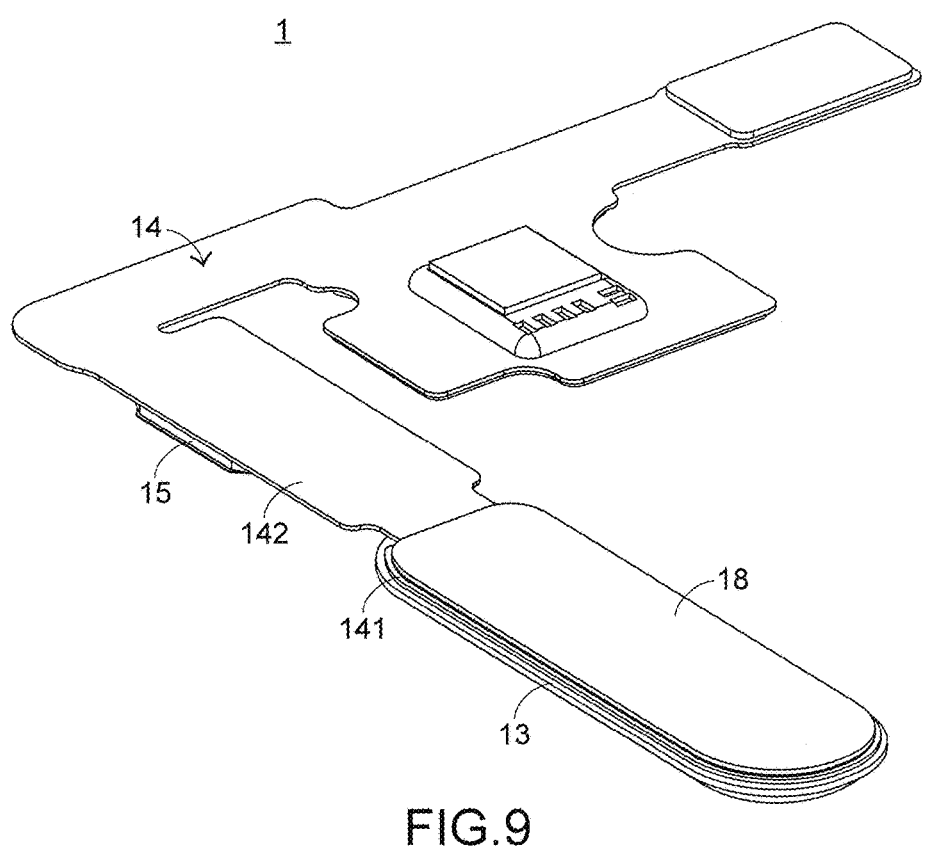
FIGS. 9, 10 and 11 illustrate a flowchart of the step D of the method for assembling the fingerprint identification module according to the first embodiment of the present invention.
Figure 10:
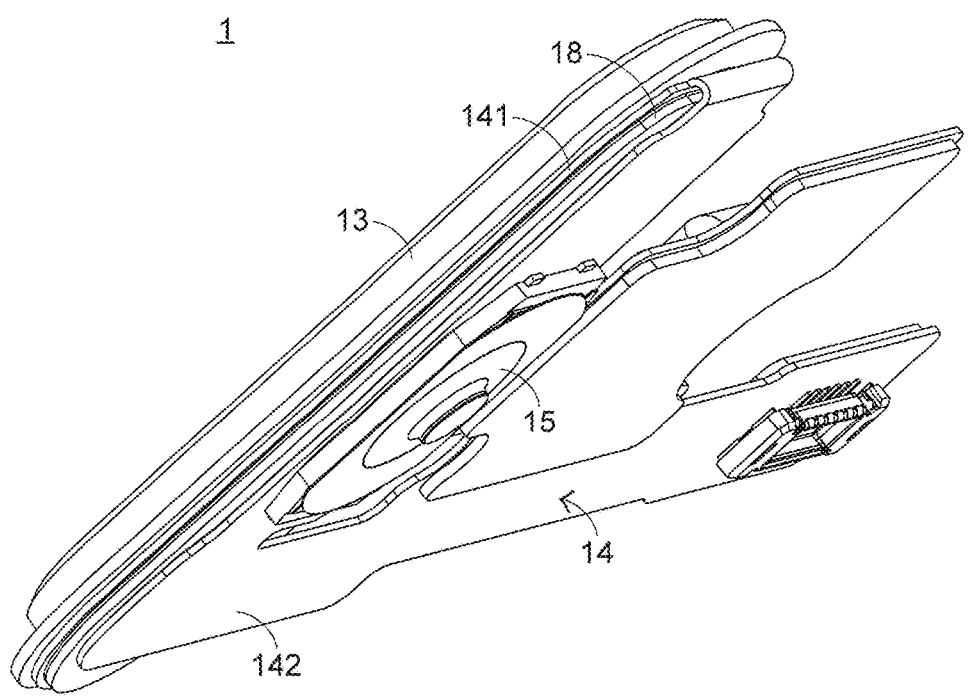
Figure 11:
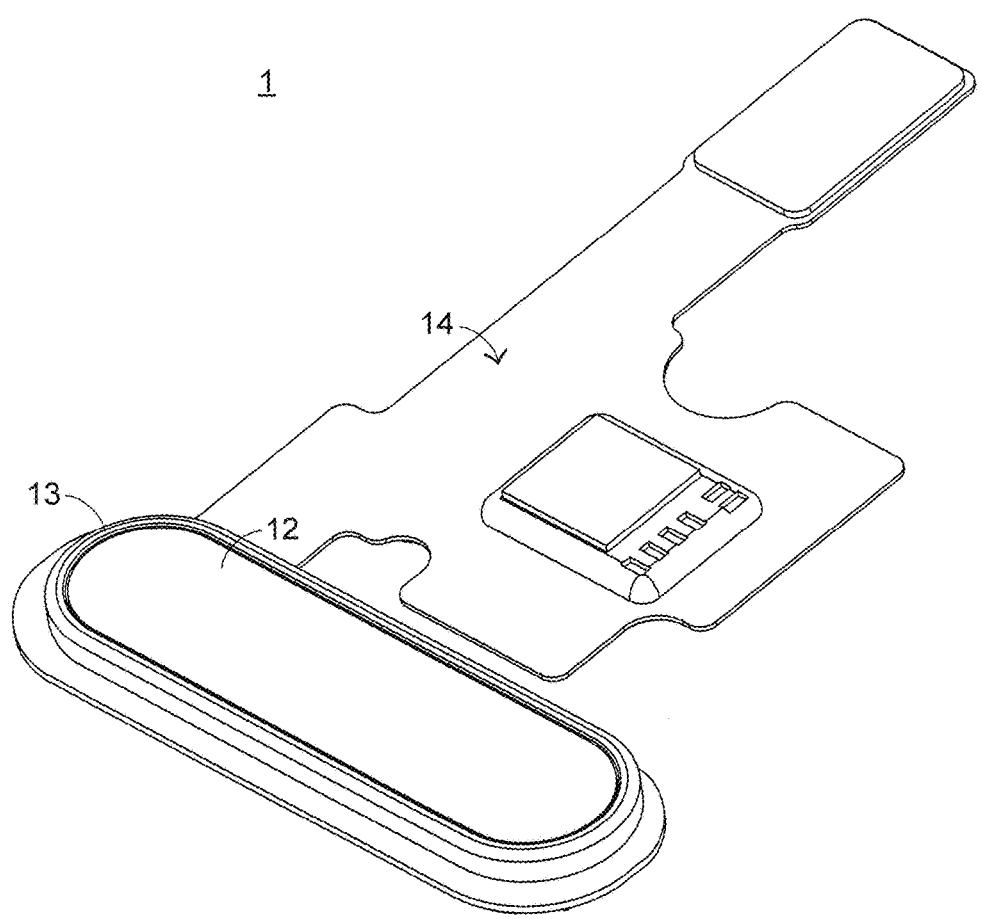

Please refer to FIGS. 2, 9, 10 and 11. FIGS. 9, 10 and 11 illustrate a flowchart of the step D of the method for assembling the fingerprint identification module according to the first embodiment of the present invention. After the desired adhesive thickness is obtained, the step D is performed. That is, plural adhesive films with various thicknesses are prepared. Then, an adhesive film 18 corresponding to the adhesive thickness is acquired, and the adhesive film 18 is placed on the backside of the first region 141 of the circuit board 14 (see FIG. 9). Then, the first region 141 of the circuit board 14 is folded and stacked on the second region 142 of the circuit board 14, and thus the fingerprint identification module 1 is assembled. Meanwhile, as shown in FIG. 10, the adhesive film 18 is arranged between the second region 142 of the circuit board 14 and the folded first region 141 of the circuit board 14. After the fingerprint sensing element 11 and the triggering element 15 are stacked on each other, a key with a fingerprint identification function is formed. Consequently, the function of the electronic product becomes more diverse.

Then, a thickness checking procedure is performed. That is, in the step I, the thickness of the fingerprint identification module 1 is compared with the predetermined thickness. If the thickness of the fingerprint identification module 1 is larger than the predetermined thickness, it means that the thickness of the fingerprint identification module 1 is beyond the acceptable value. Consequently, the fingerprint identification module 1 is determined as an unqualified product (i.e., the step M). If the thickness of the fingerprint identification module 1 is equal to the predetermined thickness, the fingerprint identification module 1 is determined as a qualified product (i.e., the step L). If the thickness of the fingerprint identification module 1 is smaller than the predetermined thickness, it means that the thickness of the fingerprint identification module 1 is smaller than the acceptable value. In other words, the fingerprint identification module 1 can be remedied. Then, the step J is performed. That is, the thickness of an additional adhesive film is determined according to the difference between the thickness of the fingerprint identification module 1 and the predetermined thickness. After the step J, the step K is performed. That is, an additional adhesive film (not shown) corresponding to the additional adhesive thickness is placed on the adhesive film, and the first region 141 of the circuit board 14 is folded and stacked on the second region 142 of the circuit board 14. Meanwhile, the adhesive film 18 and the additional adhesive film are arranged between the second region 142 of the circuit board 14 and the folded first region 141 of the circuit board 14. After the step K, the step I is repeatedly done until the fingerprint identification module 1 is determined as the qualified product.

Figure 12:
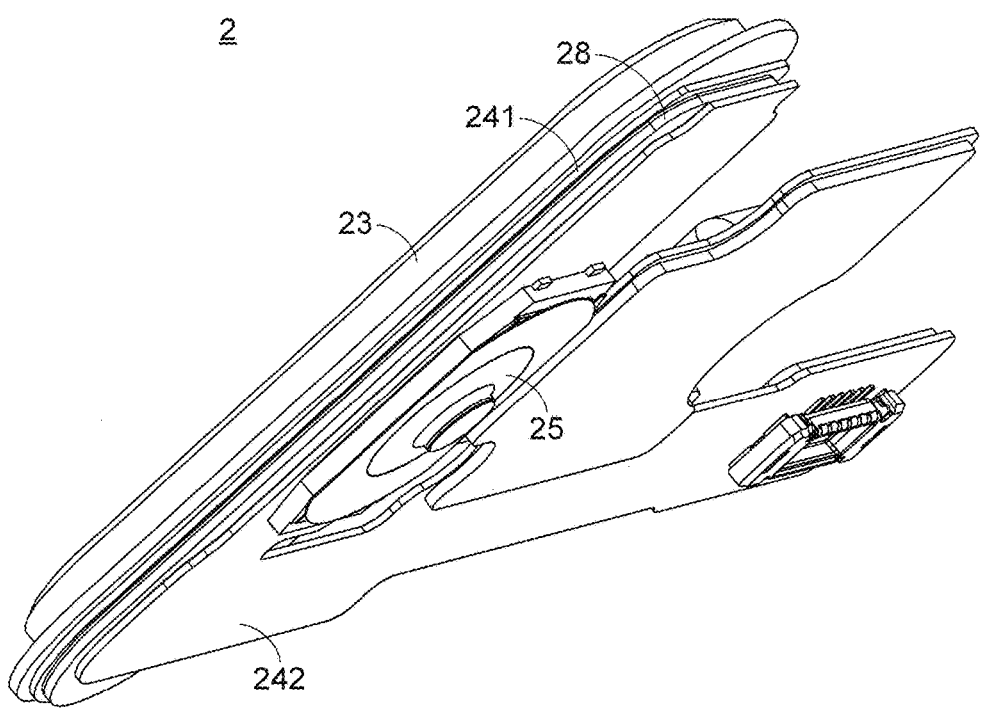
FIG. 12 is a schematic perspective view illustrating a fingerprint identification module according to a second embodiment of the present invention.
Figure 13A:
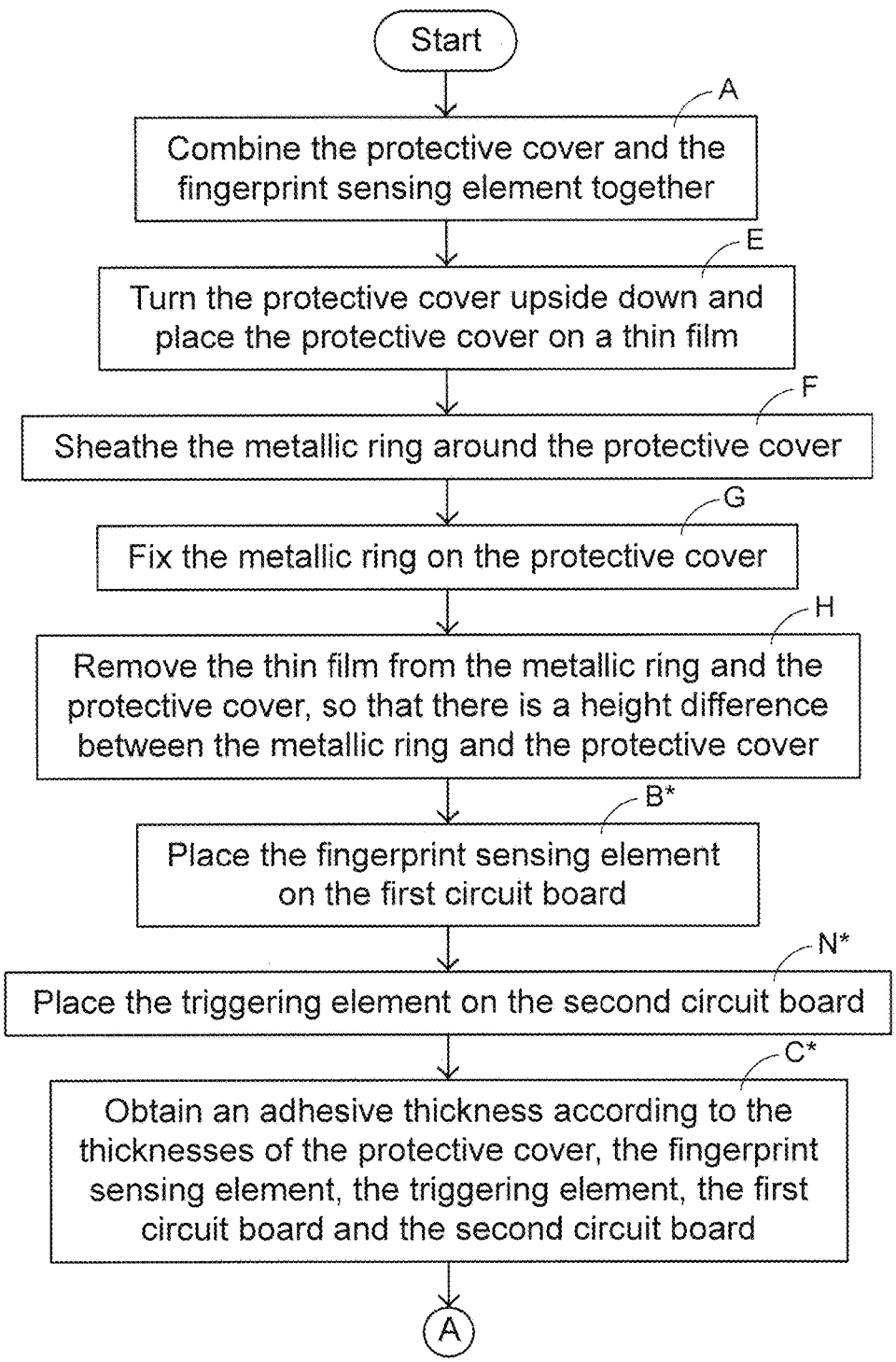
FIGS. 13A and 13B illustrate a flowchart of a method for assembling the fingerprint identification module according to the second embodiment of the present invention.
Figure 13B:
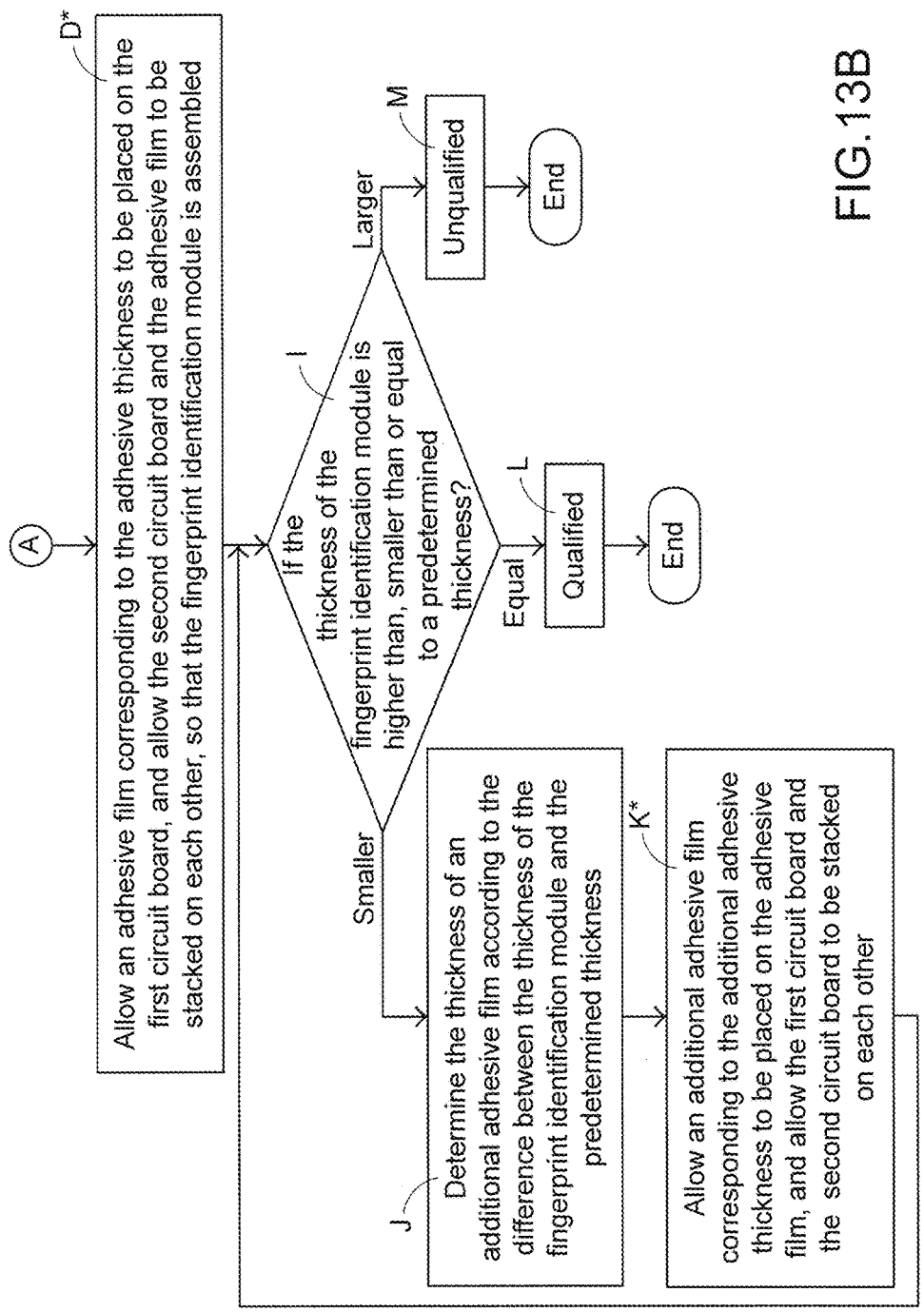

The present invention further provides a second embodiment, which is slightly distinguished from the first embodiment. Please refer to FIGS. 12, 13A and 13B. FIG. 12 is a schematic perspective view illustrating a fingerprint identification module according to a second embodiment of the present invention. FIGS. 13A and 13B illustrate a flowchart of a method for assembling the fingerprint identification module according to the second embodiment of the present invention. As shown in FIG. 12, the components of the fingerprint identification module 2 comprise a fingerprint sensing element (not shown), a protective cover (not shown), a metallic ring 23, a first circuit board 24, a triggering element 15, a second circuit board 26 and an adhesive film 28. The circuit board 14 of the first embodiment is replaced by the first circuit board 24 and the second circuit board 26 of this embodiment. The functions of the above components are similar to those of the conventional fingerprint identification module, and are not redundantly described herein.

Please refer to FIGS. 13A and 13B. The method comprises the following steps.

In a step A, the protective cover and the fingerprint sensing element are combined together.

In a step E, the protective cover is turned upside down and placed on a thin film.

In a step F, the metallic ring is sheathed around the protective cover.

In a step G, the metallic ring is fixed on the protective cover.

In a step H, the thin film is removed from the metallic ring and the protective cover, so that there is a height difference between the metallic ring and the protective cover.

In a step B*, the fingerprint sensing element is placed on the first circuit board.

In a step N*, the triggering element is placed on the second circuit board.

In a step C*, an adhesive thickness is obtained according to the thicknesses of the protective cover, the fingerprint sensing element, the triggering element, the first circuit board and the second circuit board.

In a step D*, an adhesive film corresponding to the adhesive thickness is placed on the first circuit board, and the second circuit board and the adhesive film are stacked on each other, so that the fingerprint identification module is assembled.

In a step I, the thickness of the fingerprint identification module is compared with a predetermined thickness.

In a step J, the thickness of an additional adhesive film is determined according to the difference between the thickness of the fingerprint identification module and the predetermined thickness.

In a step K*, an additional adhesive film corresponding to the additional adhesive thickness is placed on the adhesive film, and the first circuit board and the second circuit board are stacked on each other.

In a step L, the fingerprint identification module is determined as a qualified product.

In a step M, the fingerprint identification module is determined as an unqualified product.

In comparison with the first embodiment, the fingerprint sensing element and the triggering element are placed on the first circuit board and the second circuit board, respectively. Consequently, the step B*, the step N*, the step C*, the step D* and the step K* are slightly modified. However, the modifications are included within the spirit of the first embodiment. The detailed descriptions of these steps are omitted herein.

From the above descriptions, the present invention provides a method for assembling a fingerprint identification module. Firstly, the protective cover, the fingerprint sensing element and the metallic ring are combined together. Then, the stacked fingerprint sensing element is placed on the circuit board. When compared with the conventional technology, the height difference between the metallic ring and the protective cover can be adjusted according to the practical requirements. After the thickness of the stacked fingerprint sensing element and the thickness of the circuit board are measured, the first thickness is obtained. After the thickness of the triggering element and the thickness of the circuit board are measured, the second thickness is obtained. Then, the adhesive thickness is obtained by subtracting the first thickness and the second thickness from the predetermined thickness. Then, the adhesive film corresponding to the film thickness is placed on the circuit board. Afterward, the first region of the circuit board is folded and stacked on the second region of the circuit board, and thus the fingerprint identification module is assembled. The technology of the present invention is advantageous over the conventional technology. For example, the height difference between the metallic ring and the protective cover can be adjusted through the thin film. Moreover, the thickness difference between the semi-finished product and the predetermined thickness is obtained. The adhesive film corresponding to the thickness difference is used to compensate the deficient thickness. Consequently, the yield of the fingerprint identification module is increased.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A method for assembling a fingerprint identification module, the method comprising steps of:
   (A) combining a protective cover and a fingerprint sensing element together;
   (B) placing the fingerprint sensing element on a first region of a circuit board, and placing a triggering element on a second region of the circuit board, wherein the fingerprint sensing element is located beside the triggering element;

(C) obtaining an adhesive thickness according to thicknesses of the protective cover, the fingerprint sensing element, the triggering element and the circuit board; and (D) allowing an adhesive film corresponding to the adhesive thickness to be placed on the circuit board, and allowing the first region of the circuit board to be folded and stacked on the second region of the circuit board, so that the fingerprint identification module is assembled, wherein the adhesive film is arranged between the second region of the circuit board and the folded first region of the circuit board, wherein after the step (A) and before the step (B), the method further comprises:

turning the protective cover upside down, and placing the protective cover on a thin film;

sheathing a metallic ring around the protective cover, wherein the thin film and the protective cover are disposed within an opening of the metallic ring;

fixing the metallic ring on the protective cover; and removing the thin film from the opening of the metallic ring, so that there is a height difference between the metallic ring and the protective cover.

2. The method according to claim 1, wherein the step (A) comprises steps of:

(A1) applying a gluing material to the fingerprint sensing element;

(A2) stacking the protective cover on the fingerprint sensing element; and (A3) allowing the gluing material overflowing from a region between the protective cover and the fingerprint sensing element to be removed.

3. The method according to claim 1, wherein the step (B) comprises steps of:

(B1) placing the fingerprint sensing element on the first region of the circuit board by a surface mount technology, and establishing electric connection between the fingerprint sensing element and the circuit board; and (B2) placing the triggering element on the second region of the circuit board by the surface mount technology, establishing electric connection between the triggering element and the circuit board.

4. The method according to claim 1, wherein the step (C) comprises steps of:

(C1) measuring a thickness of the protective cover, a thickness of the fingerprint sensing element and a thickness of the first region of the circuit board, so that a first thickness is obtained;

(C2) measuring a thickness of the triggering element and a thickness of the second region of the circuit board, so that a second thickness is obtained; and (C3) obtaining an adhesive thickness according to a difference between the predetermined thickness and a sum of the first thickness and the second thickness.

5. The method according to claim 4, wherein after the step (D), the method further comprises steps of:

(I) judging whether the fingerprint identification module is qualified according to a result of comparing a thickness of the fingerprint identification module with the predetermined thickness;

(J) if the thickness of the fingerprint identification module is smaller than the predetermined thickness, determining a thickness of an additional adhesive film according to an additional difference between the thickness of the fingerprint identification module and the predetermined thickness; and (K) allowing an additional adhesive film corresponding to the additional adhesive thickness to be placed on the adhesive film, and allowing the first region of the circuit board to be folded and stacked on the second region of the circuit board, wherein the adhesive film and the additional adhesive film are arranged between the second region of the circuit board and the folded first region of the circuit board.

6. A method for assembling a fingerprint identification module, the method comprising steps of:

(A) combining a protective cover and a fingerprint sensing element together;

(B) placing the fingerprint sensing element on a first circuit board;

(C) placing a triggering element on a second circuit board;

(D) obtaining an adhesive thickness according to thicknesses of the protective cover, the fingerprint sensing element, the triggering element, the first circuit board and the second circuit board; and (E) allowing an adhesive film corresponding to the adhesive thickness to be placed on the first circuit board, and allowing the second circuit board and the adhesive film to be stacked on each other, so that the fingerprint identification module is assembled, wherein the adhesive film is arranged between the first circuit board and the second circuit board, wherein after the step (A) and before the step (B), the method further comprises:

turning the protective cover upside down, and placing the protective cover on a thin film;

sheathing a metallic ring around the protective cover, wherein the thin film and the protective cover are disposed within an opening of the metallic ring;

fixing the metallic ring on the protective cover; and removing the thin film from the opening of the metallic ring, so that there is a height difference between the metallic ring and the protective cover.

7. The method according to claim 6, wherein the step (A) comprises steps of:

(A1) applying a gluing material to the fingerprint sensing element;

(A2) stacking the protective cover on the fingerprint sensing element; and (A3) allowing the gluing material overflowing from a region between the protective cover and the fingerprint sensing element to be removed.

8. The method according to claim 1, wherein the step (D) comprises steps of:

(D1) measuring a thickness of the protective cover, a thickness of the fingerprint sensing element and a thickness of the first circuit board, so that a first thickness is obtained;

(D2) measuring a thickness of the triggering element and a thickness of the second circuit board, so that a second thickness is obtained; and (D3) obtaining an adhesive thickness according to a difference between the predetermined thickness and a sum of the first thickness and the second thickness.

9. The method according to claim 8, wherein after the step (D), the method further comprises steps of:

(J) judging whether the fingerprint identification module is qualified according to a result of comparing a thickness of the fingerprint identification module with the predetermined thickness;

(K) if the thickness of the fingerprint identification module is smaller than the predetermined thickness, determining a thickness of an additional adhesive film according to an additional difference between the thickness of the fingerprint identification module and the predetermined thickness; and (L) allowing an additional adhesive film corresponding to the additional adhesive thickness to be placed on the adhesive film, and allowing the second circuit board and the additional adhesive film to be stacked on each other, wherein the adhesive film and the additional adhesive film are arranged between the first circuit board and the second circuit board.

\* \* \* \* \*